(12) United States Patent
Lee

(10) Patent No.: US 7,538,279 B2
(45) Date of Patent: May 26, 2009

(54) SYSTEM FOR GROUNDING ELECTROMAGNETIC-WAVE SHIELDING BLANKET

(76) Inventor: Myoung Jun Lee, 261 W. Rivera Ct., La Habra, CA (US) 90631

( * ) Notice: Subject to any disclaimer, the term of this patent is extended or adjusted under 35 U.S.C. 154(b) by 0 days.

(21) Appl. No.: 11/679,034

(22) Filed: Feb. 26, 2007

(65) Prior Publication Data
US 2007/0199737 A1 Aug. 30, 2007

(51) Int. Cl.
*H05K 9/00* (2006.01)
(52) U.S. Cl. .................................. 174/377; 219/212
(58) Field of Classification Search ............ 174/392, 174/377; 219/212; 361/816, 818
See application file for complete search history.

(56) References Cited
U.S. PATENT DOCUMENTS
4,931,625 A * 6/1990 Marlinski ............... 219/528

6,300,597 B1 * 10/2001 Lee ........................ 219/212

* cited by examiner

Primary Examiner—Hung V Ngo
(74) Attorney, Agent, or Firm—Lee, Hong, Degerman, Kang & Waimey

(57) ABSTRACT

The present invention relates to a system for protecting a person from electromagnetic waves. The system includes an electromagnetic-wave shielding blanket, an electric conductor housed in the electromagnetic-wave shielding blanket for absorbing electromagnetic waves and transferring the electromagnetic waves to a ground, and a grounding connection for connecting the electric conductor to the ground. The system further includes an electric heating mattress housing the ground, and an electric conductor housed in the electric heating mattress for absorbing electromagnetic waves and transferring the electromagnetic waves to the ground, wherein the grounding connection connects the electric conductor of the electromagnetic-wave shielding blanket to the electric conductor of the electric heating mattress.

19 Claims, 5 Drawing Sheets

SYSTEM FOR GROUNDING ELECTROMAGNETIC-WAVE SHIELDING BLANKET

CROSS-REFERENCE TO RELATED APPLICATIONS

Pursuant to 35 U.S.C. § 119(a), this application claims the benefit of earlier filing date and right of priority to Korean Application No. 20-2006-0005130, filed on Feb. 24, 2006, the contents of which are hereby incorporated by reference herein in their entirety.

FIELD OF THE INVENTION

The present invention relates to protecting a person from electromagnetic waves, and more particularly to, a system for grounding an electromagnetic-wave shielding blanket.

BACKGROUND OF THE INVENTION

An electromagnetic-wave removal apparatus for electric heating mattresses is disclosed in Korean Patent No. 10-341280. According to the cited document, electric conducting wires spiraling in opposite directions relative to the direction of current are provided on a heating unit, thus attenuating the generation of electromagnetic waves. Further, electromagnetic waves which leak from the heating unit flow to ground through an electromagnetic-wave absorbing conductor having the heating unit therein. Thereby, the apparatus removes 95% or more of the electromagnetic waves generated in an electric heating mattress. As such, the apparatus has high efficiency.

As shown in FIG. 1, electromagnetic waves present in a residential space, such as a bedroom, are emitted from electrical appliances around a bed 6. The electrical appliances include lights 1 and 2, a television 5, a computer monitor 3, and a computer's main body 41 for example. When several electrical appliances are simultaneously used in a room, the density of electromagnetic waves in the room is increased, and thus the harmful influence exerted on the human body is increased.

In order to reduce the leakage of electromagnetic waves from the electric appliances during sleep, a method of installing an electric conductor in a blanket and grounding the electric conductor has been proposed, similar to a grounding electric heating mattress which transfers electromagnetic waves from a hot wire to the ground. The electric conductor, installed in the blanket to serve as the electromagnetic-wave absorbing device, moves released electromagnetic waves to the ground, thus shielding a sleeping person from the electromagnetic waves. Such a blanket is herein referred to as an electromagnetic-wave shielding blanket.

However, the blanket moves when in use. Thus, it is difficult to ground the blanket. Further, when a grounding apparatus of an electric heating mattress and a grounding apparatus of the electric blanket are independently installed, the environment surrounding the bed is disorderly. Therefore, in order to simplify the sleeping space while maintaining the function of shielding electromagnetic waves when using the electromagnetic-wave shielding blanket, it is desirable that the shielding blanket share a grounding apparatus with an electric heating mattress when an electric heating mattress is used.

SUMMARY OF THE INVENTION

The present invention is directed to a system for grounding an electromagnetic-wave shielding blanket.

Additional features and advantages of the invention will be set forth in the description which follows, and in part will be apparent from the description, or may be learned by practice of the invention. The objectives and other advantages of the invention will be realized and attained by the structure particularly pointed out in the written description and claims herein as well as the appended drawings.

To achieve these and other advantages and in accordance with the purpose of the present invention, as embodied and broadly described, the present invention is embodied in a system for grounding an electromagnetic-wave shielding blanket, the system comprising an electromagnetic-wave shielding blanket, an electric conductor housed in the electromagnetic-wave shielding blanket for absorbing electromagnetic waves and transferring the electromagnetic waves to a ground, and a grounding connection for connecting the electric conductor to the ground.

In one embodiment, the system further comprises an electric heating mattress housing the ground, and an electric conductor housed in the electric heating mattress for absorbing electromagnetic waves and transferring the electromagnetic waves to the ground, wherein the grounding connection connects the electric conductor of the electromagnetic-wave shielding blanket to the electric conductor of the electric heating mattress.

In one aspect of the invention, the grounding connection comprises a first ground wire having a first end connected to the electric conductor of the electromagnetic-wave shielding blanket, and a second ground wire having a first end connected to the electric conductor of the electric heating mattress, wherein a second end of the first ground wire is able to connect to a second end of the second ground wire. Preferably, the system further comprises a connector for detachably connecting the second end of the first ground wire to the second end of the second ground wire.

Preferably, the electric conductor of the electromagnetic-wave shielding blanket and the electric conductor of the electric heating mattress share the ground housed in the electric heating mattress.

In another aspect of the invention, the grounding connection comprises a first extension wire having a first end connected to the electric conductor of the electromagnetic-wave shielding blanket, a second extension wire having a first end connected to the electric conductor of the electric heating mattress, and a connecting ground wire, wherein a first end of the connecting ground wire is able to connect to a second end of the first extension wire, and a second end of the connecting ground wire is able to connect to a second end of the second extension wire. Preferably, the system further comprises a first connector for detachably connecting the first end of the connecting ground wire to the second end of the first extension wire, and a second connector for detachably connecting the second end of the connecting ground wire to the second end of the second extension wire.

Preferably, the electric conductor of the electromagnetic-wave shielding blanket is distributed throughout an internal area of the electromagnetic-wave shielding blanket. Preferably, the electric conductor of the electromagnetic-wave shielding blanket comprises at least one of a copper net, an aluminum plate and a conductive carbon fiber. Preferably, the electric conductor of the electromagnetic-wave shielding blanket is flexible such that the electromagnetic-wave shielding blanket can be folded.

In accordance with another embodiment of the present invention, a system for grounding an electromagnetic-wave shielding blanket comprises an electromagnetic-wave shielding blanket, and an electric conductor housed in the electromagnetic-wave shielding blanket for absorbing electromagnetic waves and transferring the electromagnetic waves to a ground housed in an electric heating mattress operationally connected with the electromagnetic-wave shielding blanket. Preferably, the system further comprises a grounding connection for connecting the electric conductor to the ground.

In one aspect of the invention, the system further comprises an electric conductor housed in the electric heating mattress for absorbing electromagnetic waves and transferring the electromagnetic waves to the ground, wherein the grounding connection connects the electric conductor of the electromagnetic-wave shielding blanket to the electric conductor of the electric heating mattress.

In another aspect of the invention, the grounding connection comprises a first ground wire having a first end connected to the electric conductor of the electromagnetic-wave shielding blanket, and a second ground wire having a first end connected to the electric conductor of the electric heating mattress, wherein a second end of the first ground wire is able to connect to a second end of the second ground wire. Preferably, the system further comprises a connector for detachably connecting the second end of the first ground wire to the second end of the second ground wire.

In a further aspect of the invention, the grounding connection comprises a first extension wire having a first end connected to the electric conductor of the electromagnetic-wave shielding blanket, a second extension wire having a first end connected to the electric conductor of the electric heating mattress, and a connecting ground wire, wherein a first end of the connecting ground wire is able to connect to a second end of the first extension wire, and a second end of the connecting ground wire is able to connect to a second end of the second extension wire. Preferably, the system further comprises a first connector for detachably connecting the first end of the connecting ground wire to the second end of the first extension wire, and a second connector for detachably connecting the second end of the connecting ground wire to the second end of the second extension wire.

Preferably, the electric conductor of the electromagnetic-wave shielding blanket is distributed throughout an internal area of the electromagnetic-wave shielding blanket. Preferably, the electric conductor of the electromagnetic-wave shielding blanket comprises at least one of a copper net, an aluminum plate and a conductive carbon fiber. Preferably, the electric conductor of the electromagnetic-wave shielding blanket is flexible such that the electromagnetic-wave shielding blanket can be folded.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. Features, elements, and aspects of the invention that are referenced by the same numerals in different figures represent the same, equivalent, or similar features, elements, or aspects in accordance with one or more embodiments.

DETAILED DESCRIPTION OF THE PREFERRED EMBODIMENTS

The present invention relates to a system for grounding an electromagnetic-wave shielding blanket.

Figure 1:
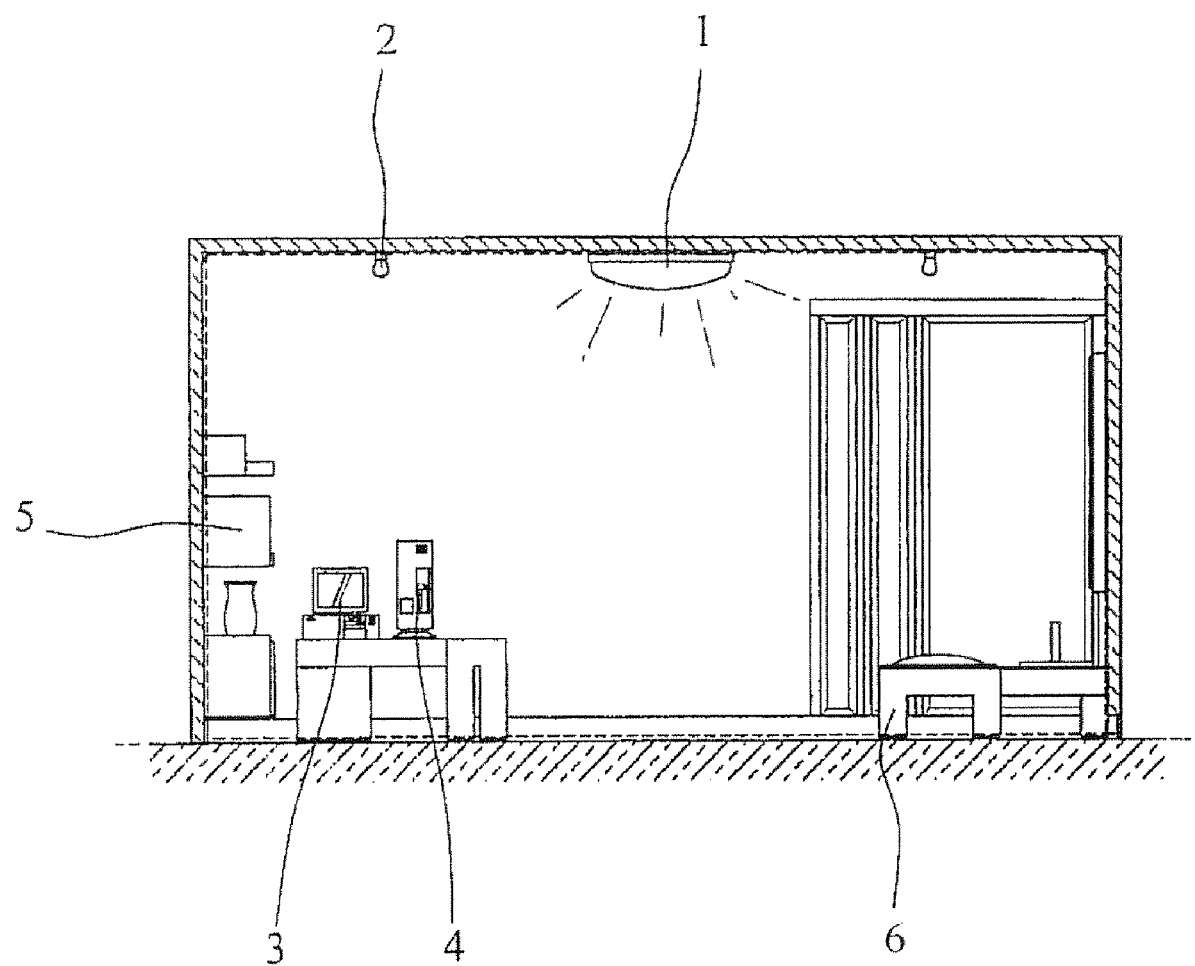
FIG. 1 is a view illustrating electrical appliances installed in a bedroom.
Figure 2:
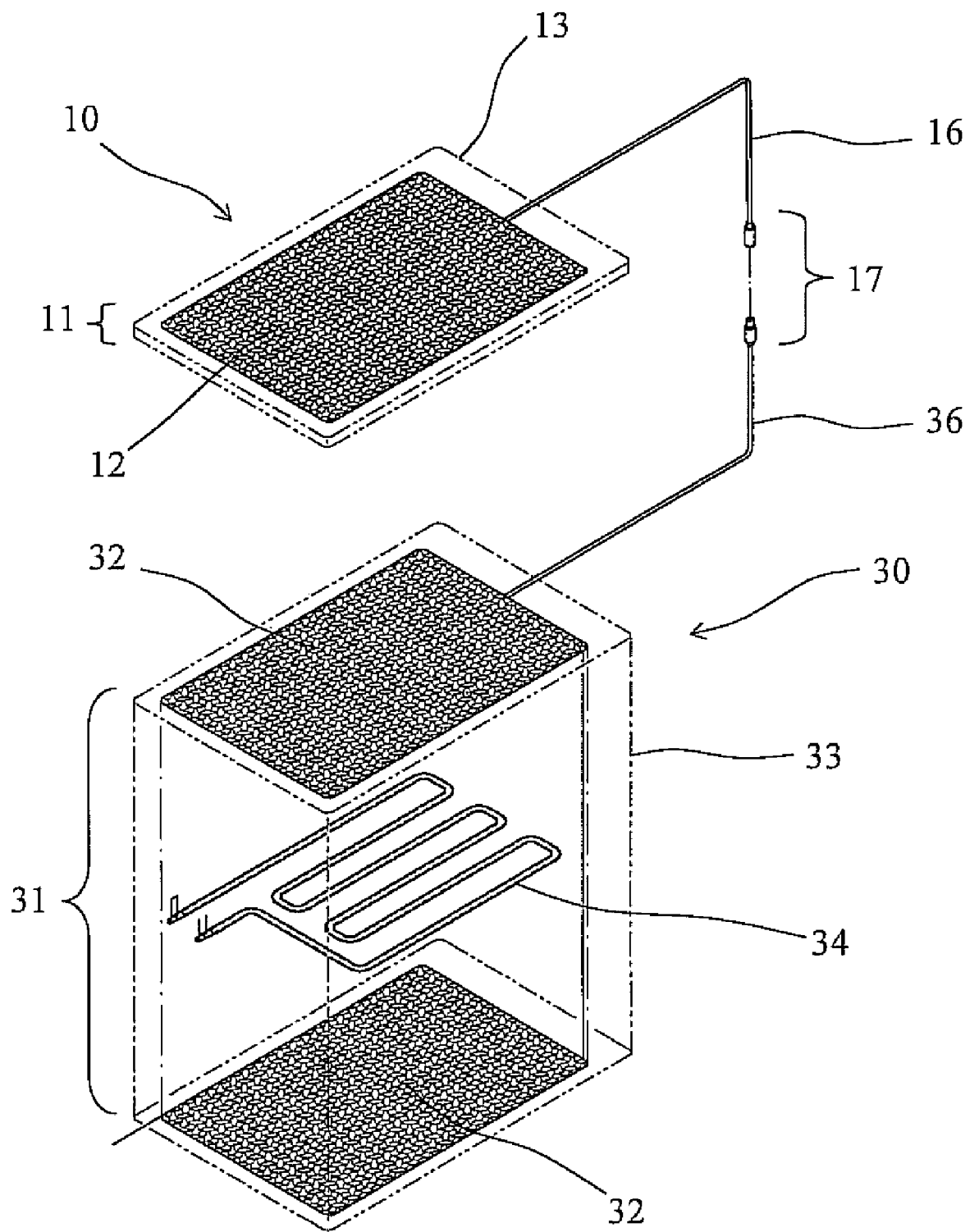
FIG. 2 is an exploded perspective view illustrating a system for grounding an electromagnetic-wave shielding blanket in accordance with one embodiment of the present invention.
Figure 3:
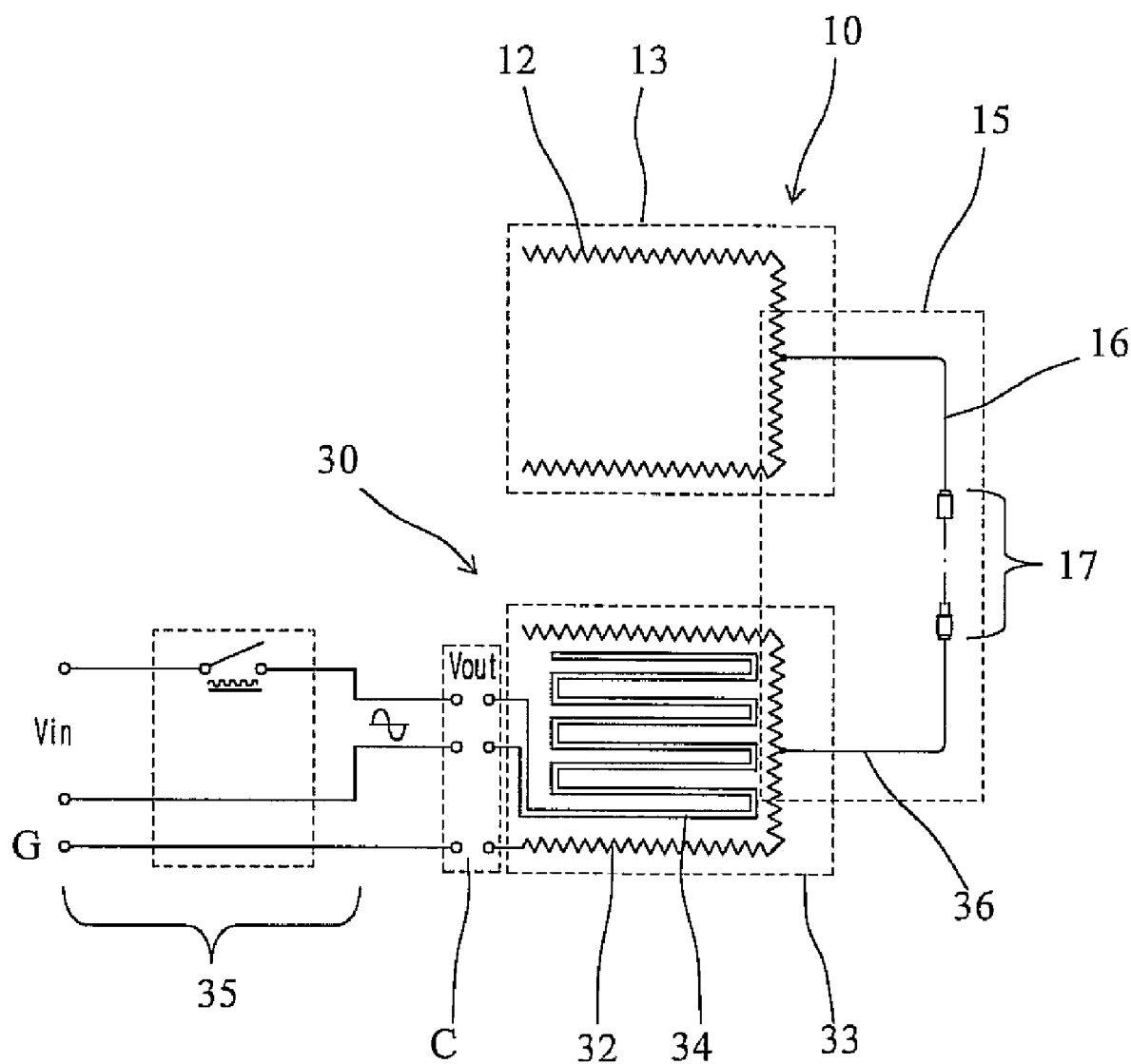
FIG. 3 is a ground circuit diagram of the system for grounding an electromagnetic-wave shielding blanket in accordance with the embodiment illustrated in FIG. 2.

The preferred embodiments of the present invention will be described in detail with reference to the accompanying drawings. FIG. 2 is an exploded perspective view illustrating a system for grounding an electromagnetic-wave shielding blanket in accordance with one embodiment of the present invention. FIG. 3 is a ground circuit diagram of the system for grounding an electromagnetic-wave shielding blanket in accordance with the embodiment illustrated in FIG. 2. Referring to FIGS. 2 and 3, the system comprises an electromagnetic-wave shielding blanket 10, an electric conductor 12 for absorbing electromagnetic waves, and a grounding connection 15 for the electromagnetic-wave shielding blanket.

The electromagnetic-wave shielding blanket 10 houses the electric conductor 12 for absorbing the electromagnetic waves and connects the electric conductor 12 to a ground. Thus, the blanket 10 serves as a shield for protecting a sleeping person from electromagnetic waves. Preferably, the electric conductor 12 for absorbing electromagnetic waves is provided in a blanket layer 11 and distributed throughout an internal area of the electromagnetic-wave shielding blanket 10. The electric conductor 12 is flexible such that the electromagnetic-wave shielding blanket 10 can be folded and spread out. Preferably, the electric conductor 12 transfers electromagnetic waves released from a source within an interior environment, such as a bedroom electrical appliance, to the ground. As shown in FIG. 3, the grounding connection 15 of the electromagnetic-wave shielding blanket 10 connects the electric conductor 12 to a ground G.

When the electric conductor 12 of the shielding blanket 10 is connected to the ground G, electric potential in the electric conductor 12 is safely grounded. Accordingly, when electromagnetic waves from an interior environment are transferred to the electric conductor 12 having the electric potential, the electromagnetic waves are discharged to the ground. As such, when a person is covered with the shielding blanket 10, electromagnetic waves emitted from electrical appliances in the interior environment are absorbed by the electric conductor 12 and discharged to the ground. Thus, the shielding blanket 10 serves as a shield to protect a person's body from the electromagnetic waves.

An electromagnetic-wave shielding blanket is advantageous in that it protects a person from electromagnetic waves. However, a typical electromagnetic-wave shielding blanket may cause inconvenience. For example, a user of a typical electromagnetic-wave shielding blanket would preferably want a broad range of blanket movement when using the blanket while sleeping. However, grounding the blanket may limit the blanket's movement.

Considering such inconveniences and complicated sleeping environments, the present invention allows the shielding blanket 10 to be easily grounded without hindering movement. Accordingly, in accordance with one embodiment of the present invention, the shielding blanket 10 is paired with a grounding electric heating mattress 30 which transfers electromagnetic waves generated from a heater 34 to the ground. The grounding connection 15 of the shielding blanket 10 is connected to an electric conductor 32 for absorbing electromagnetic waves. Preferably, the electric conductor 32 is housed in a layer 31 of the electric heating mattress 30. Therefore, the grounding connection 15 of the shielding blanket 10 shares a ground circuit 35 with the grounding electric heating mattress 30.

In accordance with the present invention, the grounding connection 15 of the shielding blanket 10, which is paired with the grounding electric heating mattress 30, comprises a first ground wire 16, a second ground wire 36, and a connector 17. The first ground wire 16 is connected to the electromagnetic-wave absorbing electric conductor 12 of the shielding blanket 10. The second ground wire 36 is connected to the electromagnetic-wave absorbing electric conductor 32 of the grounding electric heating mattress 30. The connector 17 connects the first ground wire 16 to the second ground wire 36. The grounding connection 15 of the shielding blanket 10 shares the ground circuit 35 provided in the grounding electric heating mattress 30.

During use, after the blanket is spread out, a user electrically connects the first ground wire 16 to the second ground wire 36 via the connector 17. Preferably, the length of each of the first and second ground wires 16 and 36 is set to permit sufficient movement of the blanket when a user is sleeping. Accordingly, a ground circuit of the shielding blanket 10 is grounded through the electric conductor 12 embedded in the blanket 10, the first ground wire 16, the connector 17, the second ground wire 36, the electric conductor 32 of the grounding electric heating mattress 30, a connector C of the electric heating mattress 30, and the ground circuit 35 of the grounding electric heating mattress 30.

Preferably, the shielding blanket 10 and the grounding electric heating mattress 30 are used together. Moreover, the shielding blanket 10 can be freely folded and spread out. In addition, movement of the blanket is not limited while the user is sleeping. For example, if the shielding blanket 10 is excessively moved, the connector 17 can be uncoupled to disconnect the blanket 10 from the heating mattress 30. Thus, the blankets range of motion is not hindered. If the blanket 10 and heating mattress 30 are disconnected, the connector 17 can be recoupled as desired.

Figure 4:
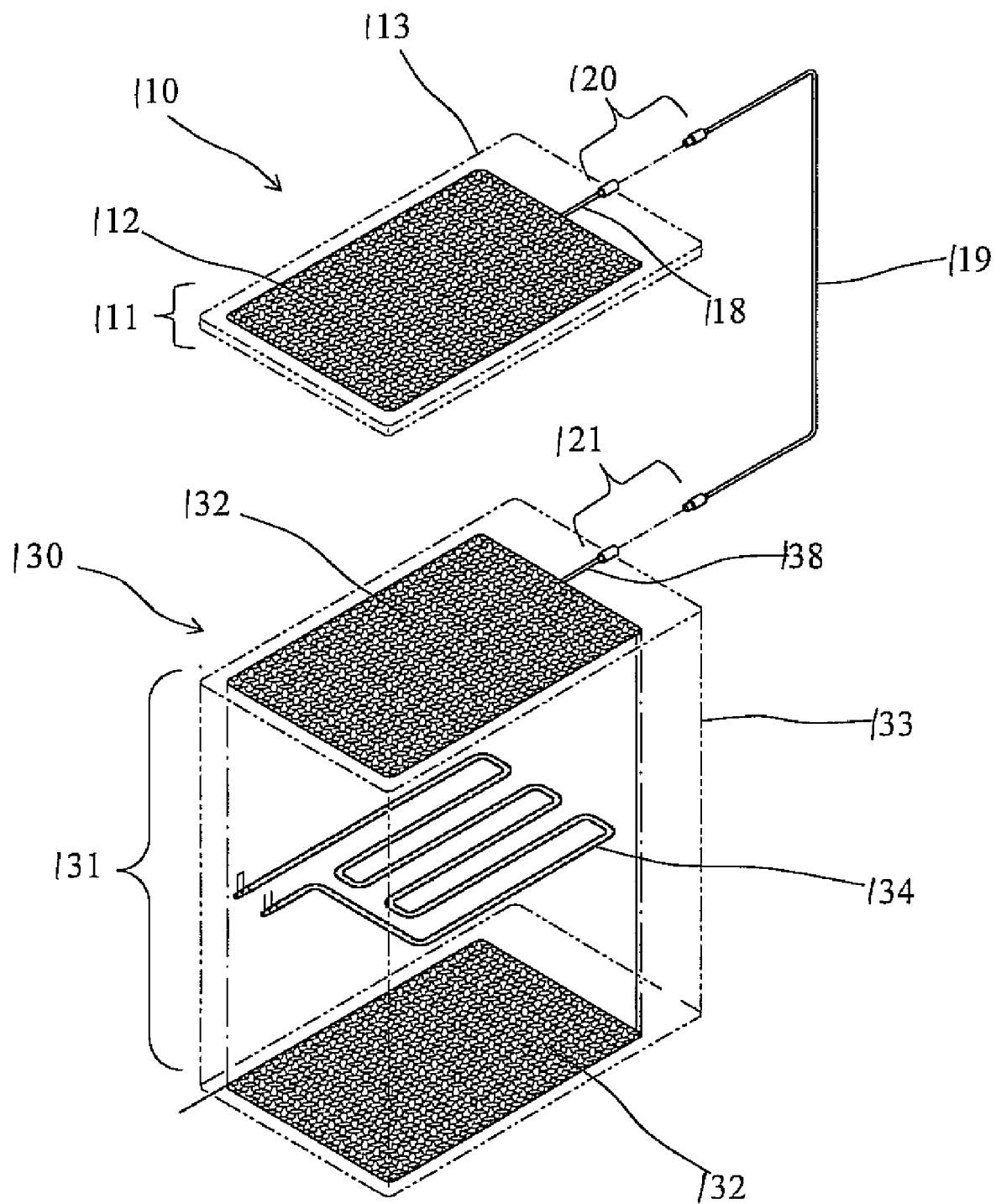
FIG. 4 is an exploded perspective view illustrating a system for grounding an electromagnetic-wave shielding blanket in accordance with another embodiment of the present invention.
Figure 5:
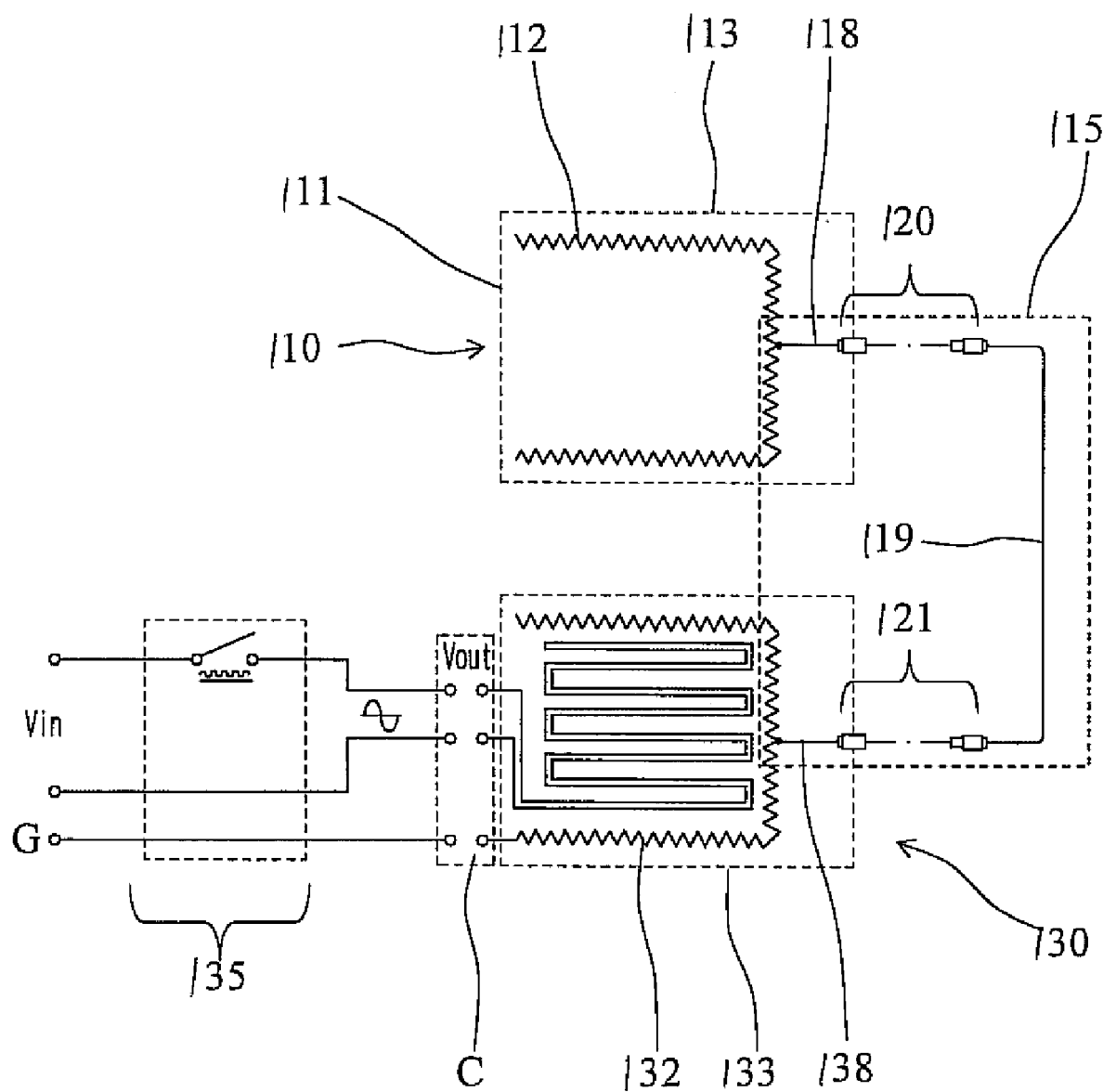
FIG. 5 is a ground circuit diagram of the system for grounding an electromagnetic-wave shielding blanket in accordance with the embodiment illustrated in FIG. 4.

FIG. 4 is an exploded perspective view illustrating a system for grounding an electromagnetic-wave shielding blanket in accordance with a second embodiment of the present invention. FIG. 5 is a ground circuit diagram of the system for grounding an electromagnetic-wave shielding blanket in accordance with the embodiment illustrated in FIG. 4. Referring to FIGS. 4 and 5, a grounding connection 115 of a shielding blanket 110 includes a first extension wire 118, a second extension wire 138, a connecting ground wire 119, and two connectors 120, 121. The first extension wire 118 extends an electromagnetic-wave absorbing electric conductor 112 of the shielding blanket 110 through a covering 113 of the shielding blanket. The second extension wire 138 extends an electromagnetic-wave absorbing electric conductor 132 of a grounding electric heating mattress 130 through a covering 133 of the electric heating mattress 130. The connecting ground wire 119 connects the first extension wire 118 to the second extension wire 138. The connectors 120 and 121 connect opposite ends of the connecting ground wire 119 to the first extension wire 118 and the second extension wire 138, respectively. The grounding connection 115 of the shielding blanket 110 shares a ground circuit 135 provided in the grounding electric heating mattress 130.

During use, after the blanket 110 is spread out, the user preferably connects the first extension wire 118 to the connecting ground wire 119 via the connector 120. Thereafter, the user connects the connecting ground wire 119 to the second extension wire 138 via the connector 121. Preferably, the length of the connecting ground wire 119 is set to permit sufficient movement of the blanket 110 while the user is sleeping. Accordingly, the grounding connection 115 is connected to the electric conductor 112 of the shielding blanket 110, the first extension wire 118, the connector 120, the connecting ground wire 119, the connector 121, the second extension wire 138, the electric conductor 132 of the grounding electric heating mattress 130, a connector C of the electric heating mattress 130, and the ground circuit 135.

In accordance with the present invention, the external appearance of the shielding blanket 110 is similar to that of a general blanket except that the connector 120 is connected to the covering 113 of the blanket 110. Likewise, the external appearance of the grounding electric heating mattress 130 is similar to that of a general electric heating mattress except that the connector 121 is attached to the covering 133 of the mattress 130.

In accordance with the present invention, the electromagnetic-wave absorbing electric conductor 12, 112 inserted into the shielding blanket 10, 110 may use at least one of a copper net, a thin aluminum plate, and a conductive carbon fiber, for example.

As described above, the present invention provides a system for grounding an electromagnetic-wave shielding blanket into which an electric conductor for absorbing electromagnetic waves is inserted. The electric conductor may comprise a copper net, a thin aluminum plate, or conductive fiber, for example. Preferably, the system for grounding the electromagnetic-wave shielding blanket may be used with an electric heating mattress, wherein the electromagnetic-wave shielding blanket shares a ground circuit with the electric heating mattress. Thus, the system is easy to use and install. Preferably, the system for grounding the electromagnetic-wave shielding blanket serves to shield a sleeping person from electromagnetic waves.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A system for protecting a person from electromagnetic waves, the system comprising:
   an electromagnetic-wave shielding blanket;
   an electric conductor housed in the electromagnetic-wave shielding blanket for conducting current generated by electromagnetic waves to a ground;

an electric heating mattress connected to the ground and operationally connectable to the electromagnetic-wave shielding blanket; and a grounding connection for connecting the electric conductor to the electric heating mattress.

2. The system of claim 1, wherein the electric conductor of the electromagnetic-wave shielding blanket is flexible such that the electromagnetic-wave shielding blanket can be folded.

3. The system of claim 1, further comprising an electric conductor housed in the electric heating mattress for conducting current generated by the electromagnetic waves to the ground, wherein the grounding connection connects the electric conductor of the electromagnetic-wave shielding blanket to the electric conductor of the electric heating mattress.

4. The system of claim 3, wherein the grounding connection comprises:

a first ground wire having a first end connected to the electric conductor of the electromagnetic-wave shielding blanket; and a second ground wire having a first end connected to the electric conductor of the electric heating mattress, wherein a second end of the first ground wire is configured to connect to a second end of the second ground wire.

5. The system of claim 4, further comprising a connector for detachably connecting the second end of the first ground wire to the second end of the second ground wire.

6. The system of claim 3, wherein the electric conductor of the electromagnetic-wave shielding blanket and the electric conductor of the electric heating mattress share the ground housed in the electric heating mattress.

7. The system of claim 3, wherein the grounding connection comprises:

a first extension wire having a first end connected to the electric conductor of the electromagnetic-wave shielding blanket;

a second extension wire having a first end connected to the electric conductor of the electric heating mattress; and a connecting ground wire, wherein a first end of the connecting ground wire is configured to connect to a second end of the first extension wire, and a second end of the connecting ground wire is configured to connect to a second end of the second extension wire.

8. The system of claim 7, further comprising:

a first connector for detachably connecting the first end of the connecting ground wire to the second end of the first extension wire; and a second connector for detachably connecting the second end of the connecting ground wire to the second end of the second extension wire.

9. The system of claim 1, wherein the electric conductor of the electromagnetic-wave shielding blanket is distributed throughout an internal area of the electromagnetic-wave shielding blanket.

10. The system of claim 1, wherein the electric conductor of the electromagnetic-wave shielding blanket comprises at least one of a copper net, an aluminum plate and a conductive carbon fiber.

11. A system for protecting a person from electromagnetic waves, the system comprising:

an electromagnetic-wave shielding blanket; and an electric conductor housed in the electromagnetic-wave shielding blanket for conducting current generated by electromagnetic waves to a ground connection of an electric heating mattress operationally connected with the electromagnetic-wave shielding blanket.

12. The system of claim 11, further comprising an electric conductor housed in the electric heating mattress for conducting the current to the ground, wherein the ground connection connects the electric conductor of the electromagnetic-wave shielding blanket to the electric conductor of the electric heating mattress.

13. The system of claim 12, wherein the ground connection comprises:

a first ground wire having a first end connected to the electric conductor of the electromagnetic-wave shielding blanket; and a second ground wire having a first end connected to the electric conductor of the electric heating mattress, wherein a second end of the first ground wire is configured to connect to a second end of the second ground wire.

14. The system of claim 13, further comprising a connector for detachably connecting the second end of the first ground wire to the second end of the second ground wire.

15. The system of claim 12, wherein the ground connection comprises:

a first extension wire having a first end connected to the electric conductor of the electromagnetic-wave shielding blanket;

a second extension wire having a first end connected to the electric conductor of the electric heating mattress; and a connecting ground wire, wherein a first end of the connecting ground wire is configured to connect to a second end of the first extension wire, and a second end of the connecting ground wire is configured to connect to a second end of the second extension wire.

16. The system of claim 15, further comprising:

a first connector for detachably connecting the first end of the connecting ground wire to the second end of the first extension wire; and a second connector for detachably connecting the second end of the connecting ground wire to the second end of the second extension wire.

17. The system of claim 11, wherein the electric conductor of the electromagnetic-wave shielding blanket is distributed throughout an internal area of the electromagnetic-wave shielding blanket.

18. The system of claim 11, wherein the electric conductor of the electromagnetic-wave shielding blanket comprises at least one of a copper net, an aluminum plate and a conductive carbon fiber.

19. The system of claim 11, wherein the electric conductor of the electromagnetic-wave shielding blanket is flexible such that the electromagnetic-wave shielding blanket can be folded.

* * * * *